(12) United States Patent
Ushiki et al.

(10) Patent No.: US 7,829,180 B2
(45) Date of Patent: Nov. 9, 2010

(54) COMPOSITION FOR FORMING ADHESIVE PATTERN, LAMINATED STRUCTURE OBTAINED BY USING SAME, AND METHOD OF PRODUCING SUCH LAMINATED STRUCTURE

(75) Inventors: Shigeru Ushiki, Hiki-gun (JP); Shohei Makita, Hiki-gun (JP); Masatoshi Kusama, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 11/947,971

(22) Filed: Nov. 30, 2007

(65) Prior Publication Data
US 2008/0124525 A1    May 29, 2008

Related U.S. Application Data

(63) Continuation of application No. PCT/JP2006/310799, filed on May 30, 2006.

(30) Foreign Application Priority Data

May 31, 2005    (JP)    .............................. 2005-158340

(51) Int. Cl.
*B32B 3/00* (2006.01)
*B32B 3/10* (2006.01)
*B32B 27/16* (2006.01)
*B32B 27/26* (2006.01)
*B32B 27/30* (2006.01)

(52) U.S. Cl. ........................ 428/201; 428/119; 428/131; 428/137; 428/138; 428/174; 428/195.1; 428/500; 428/522; 427/487; 427/508; 427/510; 522/71; 522/81; 522/150; 522/153; 156/272.2; 156/273.3; 156/290; 156/292; 156/307.1; 156/325; 156/327

(58) Field of Classification Search ...................... None
See application file for complete search history.

(56) References Cited

U.S. PATENT DOCUMENTS 3,980,483 A * 9/1976 Nishikubo et al. ........ 430/286.1

(Continued)

FOREIGN PATENT DOCUMENTS

EP    0 097 815    * 1/1984

(Continued)

OTHER PUBLICATIONS

Database WPI Week 200438, Thomson Scientific, London, GB; AN 2004-403344 XP00250822 & JP 2004 085803 A (Nippon Steel Chem. Co.) Mar. 18, 2004 *abstract* Providing a partial translation of JP 2004 085803 A.

*Primary Examiner*—Vivian Chen
(74) *Attorney, Agent, or Firm*—Oblon, Spivak, McClelland, Maier & Neustadt, L.L.P.

(57) ABSTRACT

An adhesive pattern is formed by applying a photocurable and thermosetting adhesive comprising as indispensable ingredients (A) a carboxyl group-containing photosensitive prepolymer having both a carboxyl group and an ethylenically unsaturated bond in its molecule and an acid value in the range of 30 to 160 mg KOH/g, (B) an epoxy resin, and (C) a photopolymerization initiator onto a surface of a substrate as a member to be bonded to form a coating film; selectively exposing the coating film to an active energy ray through a photomask according to a predetermined pattern, thereafter removing an unexposed portion by development with an aqueous alkaline solution. Then, a sheet member as a joining member is pressed onto the adhesive pattern mentioned above, and the adhesive pattern is thermally cured to obtain a laminated structure.

7 Claims, 1 Drawing Sheet

U.S. PATENT DOCUMENTS

| | | | | |
|---|---|---|---|---|
| 4,544,801 A | * | 10/1985 | Rudik et al. | 174/251 |
| 4,782,165 A | * | 11/1988 | Sklavounos | 548/303.7 |
| 4,786,569 A | * | 11/1988 | Rohde et al. | 430/14 |
| 4,855,333 A | * | 8/1989 | Rudik et al. | 522/71 |
| 4,918,150 A | * | 4/1990 | Sakakibara et al. | 525/502 |
| 4,948,700 A | * | 8/1990 | Maeda et al. | 430/280.1 |
| 5,049,221 A | * | 9/1991 | Wada et al. | 156/151 |
| 5,281,678 A | * | 1/1994 | Nishikawa et al. | 525/531 |
| 5,319,060 A | * | 6/1994 | Nishikawa et al. | 528/89 |
| 5,399,604 A | * | 3/1995 | Sano et al. | 524/356 |
| 5,530,036 A | * | 6/1996 | Sano et al. | 522/79 |
| 5,869,791 A | * | 2/1999 | Young | 178/20.01 |
| 5,994,776 A | * | 11/1999 | Fang et al. | 257/758 |
| 6,492,256 B2 | * | 12/2002 | Lee et al. | 438/619 |
| 6,783,840 B2 | * | 8/2004 | Watanabe et al. | 428/209 |
| 6,844,130 B2 | * | 1/2005 | Nishikubo et al. | 430/258 |
| 6,861,500 B2 | * | 3/2005 | Nishikubo et al. | 528/408 |
| 6,867,282 B2 | * | 3/2005 | Nishikubo et al. | 528/408 |
| 7,132,168 B2 | * | 11/2006 | Nishikubo et al. | 428/414 |
| 7,208,568 B2 | * | 4/2007 | Nishikubo et al. | 528/408 |
| 7,226,710 B2 | * | 6/2007 | Nishikubo et al. | 430/14 |
| 7,229,852 B2 | * | 6/2007 | Hoshika | 438/118 |
| 7,326,629 B2 | * | 2/2008 | Nagarajan et al. | 438/459 |
| 7,521,657 B2 | * | 4/2009 | Kwon et al. | 250/208.1 |
| 2004/0001961 A1 | * | 1/2004 | Ono et al. | 428/500 |
| 2004/0039087 A1 | * | 2/2004 | Nishikubo et al. | 523/500 |
| 2005/0112500 A1 | * | 5/2005 | Nishikubo et al. | 430/281.1 |
| 2006/0058412 A1 | * | 3/2006 | Kakinuma et al. | 522/168 |

FOREIGN PATENT DOCUMENTS

| | | | |
|---|---|---|---|
| EP | 0 148 601 | * | 7/1985 |
| EP | 0 581 536 | * | 2/1994 |
| EP | 0 919 873 A1 | | 6/1999 |
| JP | 03-185086 | | 8/1991 |
| JP | 06-194527 | | 7/1994 |
| JP | 08-277319 | * | 10/1996 |
| JP | 10-231354 | | 9/1998 |
| JP | 2000-181058 | * | 6/2000 |
| JP | 2000-327742 | * | 11/2000 |
| JP | 2000-355621 | * | 12/2000 |
| JP | 2001-254002 | * | 9/2001 |
| JP | 2002-332462 | * | 11/2002 |
| JP | 2004 085803 A | | 3/2004 |
| WO | WO 98/00759 | * | 1/1998 |

* cited by examiner

COMPOSITION FOR FORMING ADHESIVE PATTERN, LAMINATED STRUCTURE OBTAINED BY USING SAME, AND METHOD OF PRODUCING SUCH LAMINATED STRUCTURE

CROSS-REFERENCE TO RELATED APPLICATIONS

This is a continuation of Application PCT/JP2006/310799, filed May 30, 2006, which was published under PCT Article 21(2).

BACKGROUND OF THE INVENTION

1. Field of the Invention

This invention relates to a composition for forming an adhesive pattern, a laminated structure obtained by using the same, and a method of producing such a structure. More particularly, the present invention relates to an adhesive pattern-forming composition of a photocurable and thermosetting adhesive possessed of an adhesive function and also a function as a structural member, such as a spacer, a laminated structure of which component members are joined to each other through the medium of a cured product of the adhesive pattern formed by the use of the composition mentioned above and a method of producing the laminated structure. The photocurable and thermosetting adhesive of the present invention is suitable for the formation of the laminated structures in various display devices which require the adhesive pattern as a structural support part (called a spacer, a rib, or a barrier) of a fine pattern and, when a fine pattern is required, also suitable for the formation of the laminated structure electrically connecting other circuit pattern or the electrode of various electronic parts to the fine circuit pattern formed on various substrates, a light reflective part of a back light unit (back lighting device) or the like.

2. Description of the Prior Art

Heretofore, as an adhesive pattern used for the formation of this type of laminated structure, a thermosetting adhesive is generally used. For example, the formation of a light reflective part in a conventional back lighting unit is generally done by preparing ink by mixing a reflective material, such as titanium oxide, in transparent resin varnish as a binder and diluting the resultant mixture with an organic solvent to the viscosity suitable for printing, and applying the ink to the back surface of a light guide plate by screen printing or the like to form a predetermined pattern, such as a dotted pattern, or as disclosed in JP 6-194527 A, by printing a reflecting pattern on one side of a white plastic sheet (reflective material sheet) with ink containing a reflective material and bonding this sheet to a transparent acrylic sheet (light guide plate) by making use of adhesiveness of the formed reflecting pattern itself.

However, in the case of the thermosetting adhesive, since it is necessary to form it into a predetermined pattern by a printing technique, a fine adhesive pattern will be formed only with difficult.

In order to solve such a problem, in recent years a method of forming an adhesive pattern by a photolithography method has been developed and used for the formation of the adhesive pattern in various laminated structures (see JP 3-185086 A, for example). In the case of a photosensitive resin composition to be used for the formation of a photocurable adhesive pattern, however, since it is generally formulated as a composition of (meth)acrylate compound-photopolymerization initiator system, there is a problem that the adhesiveness to a substrate or a laminating sheet member is not sufficient. Moreover, there is much room for improvement in properties of the cured product of the adhesive pattern formed, such as hardness, resistance to heat, and resistance to chemicals.

SUMMARY OF THE INVENTION

The present invention has been made in view of the problems involved in the conventional technology mentioned above. An object of the present invention is to solve the above-mentioned problems encountered in case a fine adhesive pattern is formed by a photolithography method and to provide a composition which is capable of forming a cured product of an adhesive pattern satisfying both the excellent adhesiveness to various members, such as various substrates and various sheet members to be laminated thereon, for example, and the excellent properties, such as hardness, resistance to heat, and resistance to chemicals. A further object is to provide a laminated structure of which component members are joined to each other through the medium of a cured product of the adhesive pattern formed by the use of the composition mentioned above and a method of producing the laminated structure.

To accomplish the objects mentioned above, according to the present invention, there is provided a composition for forming an adhesive pattern of a laminated structure which is used for joining component members to each other through the medium of a cured product of the adhesive pattern formed by an alkali-developing type photolithography method, characterized in that said composition is a photocurable and thermosetting adhesive comprising as indispensable ingredients (A) a carboxyl group-containing photosensitive prepolymer having both a carboxyl group and an ethylenically unsaturated bond in its molecule and an acid value in the range of 30 to 160 mg KOH/g, (B) an epoxy resin, and (C) a photopolymerization initiator.

In accordance with the present invention, there is further provided a method of producing a laminated structure characterized by comprising the steps of applying the above-mentioned adhesive pattern-forming composition to a surface of a member to be bonded to form a coating film, selectively exposing the coating film to an active energy ray according to a predetermined pattern, thereafter removing an unexposed portion by development to form an adhesive pattern, then pressing a joining member onto the adhesive pattern mentioned above, and thermally curing the adhesive pattern mentioned above.

Furthermore, the present invention provides a laminated structure, characterized in that component members are joined to each other through the medium of a cured product of the adhesive pattern formed from the adhesive pattern-forming composition mentioned above.

Incidentally, the "laminated structure" used in this specification means such a structure that a joining member has been joined to a member to be bonded through the medium of a cured product of an adhesive pattern formed from the photocurable and thermosetting adhesive of the present invention. As the member to be bonded and the joining member, any members having arbitrary properties depending on their applications such as, for example, various insulating components, various conductive components, and various transparent or translucence components or colored components may be used. Further, as the member to be bonded and the joining member, molded products, plate-like molded products, sheets, etc. manufactured from various materials, such as glass, ceramics, metal, plastics, and paper, and any other components may be used depending on desired applications.

Since the above-mentioned photocurable and thermosetting adhesive used for forming an adhesive pattern of the laminated structure of the present invention comprises as indispensable ingredients (A) a carboxyl group-containing photosensitive prepolymer, (B) an epoxy resin, and (C) a photopolymerization initiator, it is possible to form a highly fine adhesive pattern by the selective pattern exposure to the active energy ray and development. Further, since it functions not only as an adhesive agent but also as a structural member, such as a spacer, it is possible to obtain a laminated structure of which component members are firmly joined to each other through the medium of a cured product of the above-mentioned adhesive pattern. Further, since the cured product of the adhesive pattern which joins component members excels in such properties as hardness, resistance to heat, and resistance to chemicals, it is useful for manufacture of the laminated structure having various applications.

BRIEF DESCRIPTION OF THE DRAWINGS

Other objects, features, and advantages of the invention will become apparent from the following description taken together with the drawings, in which.

DETAILED DESCRIPTION OF THE PREFERRED EMBODIMENTS

The present inventors have made a diligent study to solve the problems mentioned above. As a result, it has been found that when the above-mentioned photocurable and thermosetting adhesive comprising as indispensable ingredients (A) a carboxyl group-containing photosensitive prepolymer, (B) an epoxy resin, and (C) a photopolymerization initiator is used for the formation of an adhesive pattern of an laminated structure, it is possible to form a fine adhesive pattern on a surface of a member to be bonded by an alkali-developing type photolithography method, and that when a joining member is pressed onto the adhesive pattern mentioned above and thermally cured after the exposure to light and development, surprisingly the component members are very strongly joined to each other through the medium of a cured product of the adhesive pattern. This discovery has led to perfection of the present invention. Now, the present invention will be described with reference to the accompanying drawing.

Figure 1A:
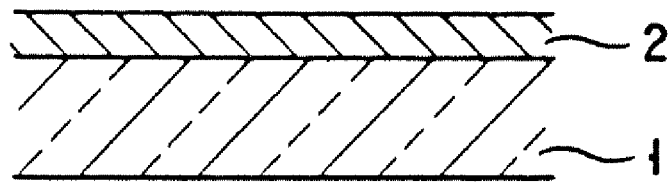
FIG. 1A through FIG. 1D are fragmentary cross-sectional views for schematically explaining the steps for the formation of the laminated structure by a photolithography method using the photocurable and thermosetting adhesive of the present invention.

FIG. 1A through FIG. 1D show an example of a method of forming an adhesive pattern by a photolithography method using the photocurable and thermosetting adhesive of the present invention. First, as shown in FIG. 1A, a coating film 2 of the photocurable and thermosetting adhesive is formed on the surface of a member to be bonded, for example a substrate 1. The formation of the coating film is carried out by adjusting, when necessary, the viscosity of the photocurable and thermosetting adhesive by adding a diluent (a photopolymerizable monomer as a reactive diluent to be described hereinafter or an organic solvent) thereto, thereafter applying the composition onto a desired substrate by a suitable coating method, such as a screen printing method, a curtain coating method, a roll coating method, a dip coating method, and a spin coating method, and then pre-drying the composition at a temperature in the approximate range of 60 to 120° C., for example, thereby to evaporate the organic solvent from the composition and give rise to a coating film.

Figure 1B:
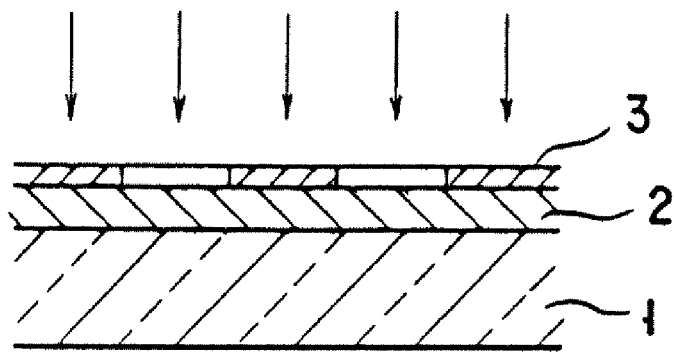

Then, the coating film of the photocurable and thermosetting adhesive formed as described above is subjected to a pattern exposure. The pattern exposure is done by superposing a photomask 3 having a prescribed exposure pattern on the coating film 2 mentioned above (although either of a contact method or a non-contact method may be adopted, the contact method is generally employed), as shown in FIG. 1B, for example, and exposing them to light by selective irradiation with the active energy ray. Alternatively, the exposure to light may be done by the direct imaging with the laser beam or the like according to the pattern.

As the light source for irradiation with the active energy ray, a low-pressure mercury vapor lamp, a medium-pressure mercury vapor lamp, a high-pressure mercury vapor lamp, an ultra-high-pressure mercury vapor lamp, a xenon lamp, a metal halide lamp, and various laser beams are suitably used. Further, electron beams, $\alpha$-rays, $\beta$-rays, $\gamma$-rays, X-rays, neutron beams, etc. may be utilized.

Figure 1C:
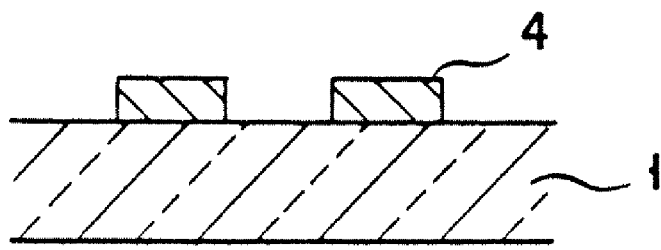

After the photomask 3 has been removed (or in the state as it is when the exposure to light is done by the direct imaging with the laser beam or the like), the unexposed area of the coating film is developed with a dilute aqueous alkaline solution, for example, to obtain a prescribed adhesive pattern 4 as schematically illustrated in FIG. 1C. Incidentally, it is also possible to form the adhesive pattern of desired height by repeating the steps of application, exposure to light, and development. As an adhesive pattern, various patterns of which elements constituting the pattern are dots, lines and surface regions arranged at an arbitrary distance, for example the stripe-like pattern, spot-like pattern, or mesh-like pattern may be formed according to a desired application.

As an aqueous alkaline solution to be used in the process of development mentioned above, aqueous alkaline solutions of sodium hydroxide, potassium hydroxide, sodium carbonate, potassium carbonate, sodium silicate, ammonia, organic amines, tetramethylammonium hydroxide, etc. may be used. The proper concentration of alkali in the developing solution is generally 0.1 to 5% by weight. As a developing method, any known methods such as dipping development, paddling development, and spraying development may be adopted.

Figure 1D:
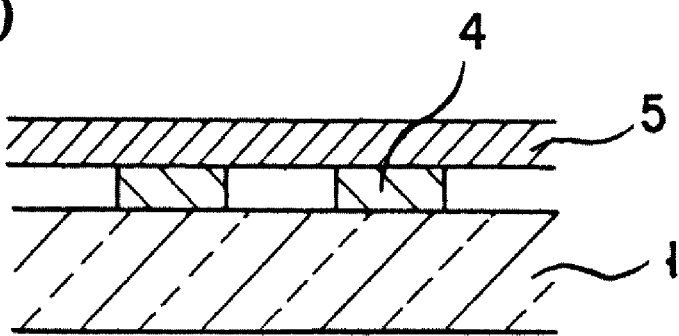

Subsequently, a joining member which should be joined, for example a sheet member 5 is pressed onto the adhesive pattern 4, as shown in FIG. 1D, and the adhesive pattern is thermally cured by heating to a temperature of about 140-200° C., preferably a temperature in the region of about 150° C. By this thermal treatment, in addition to the curing reaction of the thermosetting components in the photocurable and thermosetting adhesive, the polymerization of the photocurable resin components is promoted and the copolymerization of this component with the thermosetting component are also facilitated so that the resultant cured product of the adhesive pattern can acquire improvements in various properties such as resistance to heat, resistance to solvents, resistance to acids, adhesiveness, electrical properties, and hardness.

Incidentally, the pressure of the pressing step can be arbitrarily set according to the hardness of the adhesive pattern after exposure and development insofar as the formed adhesive pattern does not collapse under such pressure.

As the member to be bonded and the joining member, molded products, plate-like molded products, sheets, etc. manufactured from various materials, such as glass, ceramics, metal, plastics, and paper, and any other components may be used depending on desired applications.

Particularly, as the member to be bonded, various substrates such as a glass plate, a glass-epoxy substrate, a ceramic substrate, a metal plate, a plastic plate, composite plates of these members or composite plates of these members with other material may be used preferably, and other various materials may be used according to a desired application. Further, as the joining member which should be joined, sheet members such as a synthetic resin film, a metal film, a glass sheet, a paper, a paper-synthetic resin composite film, and a paper-metal foil-synthetic resin composite film may be preferably used, and other various materials may be used according to a desired application. These members to be bonded and/or the joining members which have subjected to machining such as perforation may also be used.

Incidentally, these members to be bonded and joining members are required to withstand the temperature of a thermal curing treatment.

Next, the photocurable and thermosetting adhesive used for the formation of an adhesive pattern according to the present invention will be described in detail.

As the carboxyl group-containing photosensitive prepolymer (A) to be used in the present invention, a carboxyl group-containing photosensitive prepolymer (A-1) obtained by the esterification (complete esterification or partial esterification, preferably complete esterification) of an epoxy group of (a) a polyfunctional epoxy compound having at least two epoxy groups in its molecule with a carboxyl group of (b) an unsaturated monocarboxylic acid and the subsequent addition reaction of (c) a saturated or unsaturated polybasic acid anhydride with a resultant secondary hydroxyl group produced in the esterification mentioned above can be used preferably.

Since the carboxyl group-containing photosensitive prepolymer (A-1) mentioned above has a plurality of free carboxyl groups added to the side chains of a backbone polymer, the photocurable and thermosetting adhesive containing this photosensitive prepolymer is developable with a dilute aqueous alkaline solution. Accordingly, it is possible to form a prescribed pattern by applying the composition onto a substrate, selectively exposing the resultant coating film to light and then developing the exposed coating film with an aqueous alkaline solution.

As the polyfunctional epoxy compound (a) mentioned above, any epoxy resins my be used. As the typical examples of the polyfunctional epoxy compound, various well-known and popularly adopted polyfunctional epoxy compounds of bisphenol A type, hydrogenated bisphenol A type, bisphenol F type, bisphenol S type, phenol novolak type, cresol novolak type, bisphenol A novolak type, biphenol type, bixylenol type, N-glycidyl type or the like may be cited. These polyfunctional epoxy compounds (a) may be used either singly or in the form of a combination of two or more members.

On the other hand, as concrete examples of the unsaturated monocarboxylic acid (b), acrylic acid, methacrylic acid, crotonic acid, maleic acid, fumaric acid, itaconic acid, cinnamic acid, α-cyanocinnamic acid, β-styrylacrylic acid, β-furfuryl acrylic acid, or the like may be cited. These unsaturated monocarboxylic acid (b) may be used either singly or in the form of a combination of two or more members.

As concrete examples of the saturated or unsaturated polybasic acid anhydride (c), succinic anhydride, maleic anhydride, itaconic anhydride, adipic anhydride, phthalic anhydride, tetrahydrophthalic anhydride, hexahydrophthalic anhydride, methylhexahydrophthalic anhydride, itaconic anhydride, methylendomethylenetetrahydrophthalic anhydride, trimellitic anhydride, pyromellitic anhydride or the like may be cited. Further, a partial reaction product of pyromellitic anhydride with a hydroxyl group-containing unsaturated compound such as hydroxyalkyl(meth)acrylate like 2-hydroxyethyl(meth)acrylate and 2-hydroxypropyl(meth)acrylate may be cited. These polybasic acid anhydrides (c) may be used either singly or in the form of a combination of two or more members.

As the other the carboxyl group-containing photosensitive prepolymer (A), the following carboxyl group-containing photosensitive prepolymers (A-2) may be cited:

(1) a carboxyl group-containing photosensitive prepolymer obtained by the reaction of an unsaturated monocarboxylic acid, such as (meth)acrylic acid, with an oligomer or polymer having an epoxy group in its side chain, for example a copolymer composed of a compound having an unsaturated double bond, such as an alkyl(meth)acrylate, and a compound having an unsaturated double bond and an epoxy group in its molecule, such as a glycidyl(meth)acrylate, and the subsequent partial addition reaction of a saturated or unsaturated polybasic acid anhydride with the resultant secondary hydroxyl group, (2) a carboxyl group-containing photosensitive prepolymer obtained by the reaction of an unsaturated monocarboxylic acid, such as (meth)acrylic acid, with an oligomer or polymer having a hydroxyl group and an epoxy group, for example a copolymer composed of a hydroxyalkyl(meth)acrylate, an alkyl(meth)acrylate, and a glycidyl(meth)acrylate, and the subsequent partial addition reaction of a saturated or unsaturated polybasic acid anhydride with the resultant product, (3) a carboxyl group-containing photosensitive prepolymer obtained by causing an unsaturated compound having an unsaturated double bond and an epoxy group in its molecule, such as glycidyl(meth)acrylate, to partially react with an oligomer or polymer having a carboxyl group, for example a copolymer composed of an alkyl (meth)acrylate and (meth)acrylic acid, (4) a carboxyl group-containing photosensitive prepolymer obtained by the addition reaction of a saturated or unsaturated polybasic acid anhydride with a hydroxyl group-containing polymer and the subsequent reaction of part of the carboxylic groups of the resultant reaction product with (c) an unsaturated compound having an unsaturated double bond and an epoxy group in its molecule, and (5) a carboxyl group-containing photosensitive prepolymer obtained by causing a hydroxyl group-containing (meth)acrylate, such as a hydroxyalkyl(meth)acrylate, to react with a copolymer composed of an unsaturated polybasic acid anhydride, such as maleic anhydride, and an aromatic or aliphatic hydrocarbon having a vinyl group, such as styrene and isobutylene.

Although these carboxyl group-containing photosensitive prepolymers (A-2) may be used singly, it is desirable that the carboxyl group-containing photosensitive prepolymer (A-2) should be used together with the carboxyl group-containing photosensitive prepolymer (A-1) mentioned above from the viewpoint of adhesiveness of the formed adhesive pattern to the member to be bonded or the joining member. The amount of the carboxyl group-containing photosensitive prepolymer (A-2) mentioned above is preferred to account for a proportion of not more than 50% by weight based on the total amount of the carboxyl group-containing photosensitive prepolymer.

The acid value of the carboxyl group-containing photosensitive prepolymer (A) mentioned above, though having an appropriate range thereof varied with the kind of prepolymer, should fall in the range of 30 to 160 mg KOH/g, preferably in the range of 45 to 120 mg KOH/g. If the acid value is smaller than 30 mg KOH/g, the solubility of the prepolymer in an aqueous alkaline solution will be insufficient. Conversely, if the acid value is larger than 160 mg KOH/g, the fastness of adhesion of the coating film will be deteriorated and the photo-cured part (exposed part) will tend to produce dissolution during the course of development because the hydrophilic nature becomes too high.

As the epoxy resin (B) mentioned above, all polyfunctional epoxy resins heretofore known in the art may be used. For example, polyfunctional epoxy compounds having two or more epoxy groups in its molecule, such as bisphenol A type epoxy resins represented by EPIKOTE 828, EPIKOTE 834, EPIKOTE 1001, and EPIKOTE 1004 produced by Japan Epoxy Resin K.K., EPICLON 840, EPICLON 850, EPICLON 1050, and EPICLON 2055 produced by Dainippon Ink and Chemicals Inc., Epo Tohto YD-011, YD-013, YD-127, and YD-128 produced by Tohto Kasei Co., Ltd., and Sumi-epoxy ESA-011, ESA-014, ELA-115, and ELA-128 produced by Sumitomo Chemical Co., Ltd. (all trade names); brominated epoxy resins represented by EPIKOTE YL903 produced by Japan Epoxy Resin K.K., EPICLON 152 and EPICLON 165 produced by Dainippon Ink and Chemicals Inc., Epo Tohto YDB-400 and YDB-500 produced by Tohto Kasei Co., Ltd., and Sumi-epoxy ESB-400 and ESB-700 produced by Sumitomo Chemical Co., Ltd. (all trade names); novolak type epoxy resins represented by EPIKOTE 152 and EPIKOTE 154 produced by Japan Epoxy Resin K.K., EPICLON N-730, EPICLON N-770, and EPICLON N-865 produced by Dainippon Ink and Chemicals Inc., Epo Tohto YDCN-701 and YDCN-704 produced by Tohto Kasei Co., Ltd., EPPN-201, EOCN-1025, EOCN-1020, EOCN-104S, and RE-306 produced by Nippon Kayaku Co., Ltd., and Sumi-epoxy ESCN-195× and ESCN-220 produced by Sumitomo Chemical Co., Ltd. (all trade names); bisphenol F type epoxy resins represented by EPICLON 830 produced by Dainippon Ink and Chemicals Inc., EPIKOTE 807 produced by Japan Epoxy Resin K.K., and Epo Tohto YDF-170, YDF-175, and YDF-2004 produced by Tohto Kasei Co., Ltd. (all trade names); hydrogenated bisphenol A type epoxy resins represented by Epo Tohto ST-2004, ST-2007, and ST-3000 produced by Tohto Kasei Co., Ltd. (all trade names); glycidylamine type epoxy resins represented by EPIKOTE 604 produced by Japan Epoxy Resin K.K., Epo Tohto YH-434 produced by Tohto Kasei Co., Ltd., and Sumi-epoxy ELM-120 produced by Sumitomo Chemical Co., Ltd. (all trade names); alicyclic epoxy resins represented by Celloxide 2021 (trade name) produced by Daicel Chemical Industries, Ltd.; trihydroxyphenyl methane type epoxy resins represented by YL-933 produced by Japan Epoxy Resin K.K., and EPPN-501 and EPPN-502 produced by Nippon Kayaku Co., Ltd. (all trade names); bixylenol type or biphenol type epoxy resins or mixtures thereof represented by YL-6056, YX-4000, and YL-6121 produced by Japan Epoxy Resin K.K. (all trade names); bisphenol S type epoxy resins represented by EBPS-200 produced by Nippon Kayaku Co., Ltd., EPX-30 produced by Asahi Denka Kogyo K.K., and EXA-1514 produced by Dainippon Ink and Chemicals Inc. (all trade names); bisphenol A novolak type epoxy resins represented by EPIKOTE 157S (trade name) produced by Japan Epoxy Resin K.K.; tetraphenylol ethane type epoxy resins represented by EPIKOTE YL-931 (trade names) produced by Japan Epoxy Resin K.K.; heterocyclic epoxy resins represented by TEPIC and TEPIC-H (all trade names) produced by Nissan Chemical Industries Ltd.; diglycidyl phthalate resin represented by BLEMMER DGT (trade name) produced by Nippon Oil and Fats Co., Ltd.; tetraglycidyl xylenoyl ethane resins represented by ZX-1063 (trade name) produced by Tohto Kasei Co., Ltd.; naphthalene group-containing epoxy resins represented by ESN-190 and ESN-360 produced by Shinnittetsu Chemical Co., Ltd. and HP-4032, EXA-4750, and EXA-4700 produced by Dainippon Ink and Chemicals Inc. (all trade names); dicyclopentadiene skeleton-containing epoxy resins represented by HP-7200 and HP-7200H (all trade names) produced by Dainippon Ink and Chemicals Inc.; glycidylmethacrylate copolymer type epoxy resins represented by CP-50S and CP-50M (all trade names) produced by Nippon Oil and Fats Co., Ltd.; and copolymeric epoxy resin of cyclohexylmaleimide and glycidyl methacrylate may be cited. These epoxy resins may be used either singly or in the form of a combination of two or more members.

The amount of the epoxy resin (B) to be incorporated in the composition as a thermosetting component is preferred to be such that the epoxy group content in the epoxy resin falls in the range of 0.6 to 2.0 equivalent weights, preferably 0.8 to 1.6 equivalent weights per one equivalent weight of the carboxyl group of the carboxyl group-containing photosensitive prepolymer (A) mentioned above. If the amount of the epoxy group is less than 0.6 equivalent weight, undesirably the carboxyl group will remain in the cured product so that the resistance to alkalis and the electrical insulation properties will be deteriorated. Conversely, if the amount of the epoxy group exceeds 2.0 equivalent weights, undesirably the excess epoxy resin will function as a plasticizer and thus the strength of the coating film will be deteriorated.

Further, as a promoter for the reaction of the epoxy resin (B) and the carboxyl group-containing photosensitive prepolymer (A) mentioned above, a well-known epoxy curing promoter such as amines, dicyandiamide, urea derivatives, melamine, S-triazine compounds, guanamine compounds, imidazole compounds such as 2-ethyl-4-methylimidazole and derivatives thereof may be used in combination therewith. When the composition containing the epoxy curing promoter together with the above components is thermally cured, it is possible to improve various properties of the cured film, such as resistance to heat, resistance to chemicals, adhesiveness, and pencil hardness.

As concrete examples of the photopolymerization initiators (C) mentioned above, benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-morpholinophenyl)-butanone-1; anthraquinones such as 2-methylanthraquinone, 2-ethylanthraquinone, 2-t-butyl-anthraquinone, and 1-chloroanthraquinone; thioxanthones such as 2,4-dimethylthioxanthone, 2,4-diethylthioxanthone, 2-chloro-thioxanthone, and 2,4-diisopropylthioxanthone; ketals such as acetophenone dimethyl ketal and benzyl dimethyl ketal; benzophenones such as benzophenone; or xanthones; phosphine oxides such as (2,6-dimethoxybenzoyl)-2,4,4-pentyl phosphine oxide, bis(2,4,6-trimethylbenzoyl)-phenyl phosphine oxide, 2,4,6-trimethylbenzoyl-diphenyl phosphine oxide, and ethyl-2,4,6-trimethylbenzoyl-phenyl phosphinate; and various peroxides may be cited. These well known and widely used photopolymerization initiators may be used either singly or in the form of a combination of two or more members. The amount of the photopolymerization initiator (C) to be incorporated into the composition may be in the conventionally used range, preferably 1 to 20 parts by weight, based on 100 parts by weight of the photosensitive prepolymer (A) mentioned above.

Further, the photopolymerization initiator mentioned above may be used in combination with one or more photosensitizers, such as tertiary amines like ethyl N,N-(dimethylamino)benzoate, isoamyl N,N-(dimethylamino)benzoate, pentyl-4-dimethylamino benzoate, triethylamine, and triethanolamine, and a lueco dye.

Where the photo-curing depth is required to be greater, such a titanothene type photopolymerization initiator as the product of Ciba Specialty Chemicals K.K., CGI 784, which initiates radical polymerization in a visible region may be optionally used as a curing aid in combination with the above photopolymerization initiator.

The photocurable and thermosetting adhesive used in the present invention may optionally incorporate therein a photopolymerizable monomer for the purpose of improving the photo-curing properties of the composition.

As typical examples of the photopolymerizable monomer, hydroxyalkyl (meth)acrylates such as 2-hydroxyethyl(meth) acrylate and 2-hydroxypropyl (meth)acrylate; mono- or di-(meth)acrylates of glycols such as ethylene glycol, methoxytetraethylene glycol, and polyethylene glycol; (meth) acrylamides such as N,N-dimethyl(meth)acrylamide and N-methylol (meth)acrylamide; aminoalkyl (meth)acrylates such as N,N-dimethylaminoethyl(meth)acrylate; polyfunctional (meth)acrylates of polyhydric alcohols such as hexane diol, trimethylol propane, pentaerythritol, ditrimethylol propane, dipentaerythritol, and tris-hydroxyethyl isocyanurate, and ethylene oxide adducts or propylene oxide adducts of these polyhydric alcohols; (meth)acrylates of ethylene oxide adducts or propylene oxide adducts of phenols such as phenoxyethyl(meth)acrylate and bisphenol A polyethoxy di(meth)acrylate; (meth)acrylates of glycidyl ethers such as glycerin diglycidyl ether, trimethylol propane triglycidyl ether, and triglycidyl isocyanurate; and melamine (meth) acrylate may be cited. Further, a reaction product of a hydroxyl group-containing (meth)acrylate and polyfunctional carboxylic anhydride compound may be cited. When these photopolymerizable monomers are used by mixing with the photosensitive prepolymer mentioned above, they not only function as a diluent but also improve the photo-curing properties and the developability of the produced composition.

Incidentally, the amount of the photopolymerizable monomer to be used is desired to be not more than 60 parts by weight, based on 100 parts by weight of the carboxyl group-containing photosensitive prepolymer (A) mentioned above. The amount of the photopolymerizable monomer larger than the upper limit of the range mentioned above is not desirable because a tack-free touch of finger of a coating film will be impaired.

Further, the photocurable and thermosetting adhesive used in the present invention may optionally incorporate therein various pigments and conductive particles. As the pigments, any heretofore known arbitrary pigments, for example, green pigments such as phthalocyanine green, blue pigments such as phthalocyanine blue, yellow pigments such as monoazo pigment and disazo pigment, red pigments such as molybdenum red and red oxide, black pigments such as carbon black, lamp black, bone black, graphite, iron black, copper-chromium-based black, copper-iron-manganese-based black, cobalt-iron-chromium-based black, cobalt oxides like tricobalt tetroxide, and ruthenium oxides, purple pigments such as quinacridone violet and dioxazine violet, white pigments such as titanium oxide (titanium dioxide pigment or titanium white) and zinc oxide, may be used depending on a desired application, either singly or in the combination of two or more members. As the conductive particles, metal particles of copper, silver, nickel, aluminum, tin, platinum, tungsten, gold, palladium, or solder and resin particles covered with a layer of the above-mentioned metal may be cited.

The average particle diameter of such pigments or conductive particles is desired to be not more than 20 μm, preferably not more than 5 μm from the viewpoint of resolution. The amount of such pigments or conductive particles may be set at an arbitrary amount according to a desired application insofar as the effects of the present invention are not impaired.

The photocurable and thermosetting adhesive used in the present invention may incorporate therein glass frit, ceramic fine particles such as alumina, cordierite, and zircon, and filler components such as barium sulfate, talc, silica, titanium oxide, aluminum oxide, and calcium carbonate for the purpose of enhancing the characteristics of a coating film such as adhesiveness and hardness or according to a desired application. Further, for the purpose of preventing the secondary flocculation and improving the dispersibility of the pigments, conductive particles and filler components, their surfaces may be treated with such a treating agent as an organic acid, an inorganic acid, and a phosphoric acid compound (inorganic phosphoric acid and organic phosphoric acid) which function as a stabilizer or a silane coupling agent, a titanate-based coupling agent, and an aluminum-based coupling agent. Alternatively, a small amount of the treating agent mentioned above may be added to the composition during the preparation thereof.

The photocurable and thermosetting adhesive used in the present invention may further optionally incorporate a diluent therein for the purpose of adjusting the viscosity of the composition. As the diluent, an organic solvent may be used besides the reactive diluent of the liquid monofunctional photopolymerizable monomer mentioned above. As the organic solvents, ketones such as methyl ethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, butyl lactate, cellosolve acetate, butyl cellosolve acetate, carbitol acetate, butyl carbitol acetate, propylene glycol monomethylether acetate, dipropylene glycol monomethyl ether acetate, and propylene carbonate; aliphatic hydrocarbons such as octane and decane; and petroleum solvents such as petroleum ether, petroleum naphtha, and solvent naphtha may be cited. These organic solvents may be used either singly or in the form of a combination of two or more members.

Further, the photocurable and thermosetting adhesive used in the present invention may optionally incorporate therein a dispersant suitable for pigments, conductive particles, and filler components to prepare a stable paste and other well-known and widely used additives such as a thermopolymerization inhibitor, a thickening agent, a plasticizer, a flowability-imparting agent, a stabilizer, an anti-foaming agent, a leveling agent, and an anti-blocking agent in such a proportion that the effects of the present invention will not be impaired. As the dispersant, a compound or high-molecular compound having a polar group, such as a carboxyl group, a hydroxyl group, and an acid ester, which exhibits affinity for pigments and filler components, for example, acid group-containing compounds such as phosphoric esters, acid group-containing copolymers, hydroxyl group-containing polycarboxylate, polysiloxane, and salts of a long chain polyaminoamide and acid ester may be used. As the dispersant which is commercially available and particularly usable advantageously, Disperbyk (registered trademark)-101, -103, -110, -111, -160, and -300 (all manufactured by BYK Japan K.K.) may be cited.

EXAMPLES

Now, the present invention will be described more specifically below with reference to examples. As a matter of course, the present invention is not limited to the following examples. Wherever "parts" is mentioned hereinbelow, it invariably refers to that based on weight unless otherwise specified.

Examples 1-4

The photocurable and thermosetting adhesives were prepared by compounding relevant components at proportions shown in Table 1, stirring them, and thereafter kneading the mixture with a three-roll mill to homogeneously disperse the components, respectively.

TABLE 1

| Components (parts by weight) | Example No. | | | |
| --- | --- | --- | --- | --- |
| | 1 | 2 | 3 | 4 |
| Varnish of carboxyl group-containing photosensitive prepolymer | 156 | 156 | 156 | 156 |
| Epoxy resin  EPIKOTE 828 | 18 | — | — | — |
| Varnish of EPIKOTE 1001 | 60 | — | — | — |
| Varnish of DEN483 | — | 75 | — | — |
| EPIKOTE YX-4000 | — | — | 75 | — |
| TEPIC-H | — | — | — | 40 |
| ARONIX M6200 | 35 | 35 | 35 | 35 |
| Irgacure 907 | 12 | 12 | 12 | 12 |
| Silicone-based anti-foaming agent | 1 | 1 | 1 | 1 |

Remarks
Varnish of carboxyl group-containing photosensitive prepolymer: varnish of carboxyl group-containing photosensitive prepolymer containing 35% of carbitol acetate, obtained by adding 0.95-1.05 mols of acrylic acid to one epoxy equivalent of a cresol novolak type epoxy resin and then further adding 0.6 mol of ttetrahydrophthalic anhydride to the resultant product
EPIKOTE 828: bisphenol A type epoxy resin manufactured by Japan Epoxy Resin K.K.
Varnish of EPIKOTE 1001: varnish of bisphenol A type epoxy resin manufactured by Japan Epoxy Resin K.K. containing 25% of carbitol acetate
Varnish of DEN 483: varnish of a novolak type epoxy resin manufactured by Dow Chemicals Co., Ltd. containing 10% of carbitol acetate
TEPIC-H: tris(2,3-epoxypropyl)isocyanurate (manufactured by Nissan Chemical Industries Ltd.)
EPIKOTE YX-4000: biphenyl type epoxy resin manufactured by Japan Epoxy Resin K.K.
ARONIX M6200: polyester oligomer containing acrylates at both terminals manufactured by TOAGOSEI CO., LTD.
Irgacure 907: 2-methyl-1-[4-(methylthio)phenyl]-2-morpholinopropan-1-one (manufactured by Ciba Specialty Chemicals K.K.)
Silicone-based anti-foaming agent: KS-66 manufactured by Shin-Etsu Chemical Industries Co., Ltd.

Each of the photocurable and thermosetting adhesives prepared as described above was applied by the screen printing technique onto the entire surface of a glass-epoxy substrate (FR-4) of 1.6 mm thickness to form a coating film of 40 μm thickness. The coating film on the substrate was dried in a hot air circulating drying oven at 80° C. for 30 minutes. Thereafter, a negative photomask adapted to form lines and spaces of 200 μm width each was tightly superposed on the coating film and exposed to light by the use of a metal halide lamp as a light source till a calculated dose of 400 mJ/cm$^2$ on the composition. Then, the coating film was developed with an aqueous 1% sodium carbonate solution of 30° C., washed with water and dried to form an adhesive pattern on the substrate.

Then, each material shown in Table 2 was tightly superposed on the adhesive pattern mentioned above and pressed fixedly thereon under the pressure of 50 g/cm$^2$, and then the adhesive pattern was thermally cured in a hot air circulating drying oven at 150° C. for 60 minutes to obtain a laminated structure. In all Examples, the shape of the adhesive pattern formed had the structure of film about 20 μm in thickness and lines and spaces of 200 μm width each. It had been confirmed that the adhesive pattern functioned as an adhesive agent and also as a highly fine structural member.

Each laminated structure obtained as describe above was tested for the adhesiveness. The results are shown in Table 2.

TABLE 2

| Sheet member | Example No. | | | |
| --- | --- | --- | --- | --- |
| | 1 | 2 | 3 | 4 |
| FR-4 substrate (thickness: 1.6 mm) | ○ | ○ | ○ | ○ |
| Polyimide film (thickness: 100 μm) | ○ | ○ | ○ | ○ |
| Paper-phenol composite substrate (thickness: 1.6 mm) | ○ | ○ | ○ | ○ |
| BT substrate*[1] (thickness: 1.6 mm) | ○ | ○ | ○ | ○ |
| Halogen-free substrate*[2] (thickness: 1.6 mm) | ○ | ○ | ○ | ○ |
| Glass plate (thickness: 1 mm) | ○ | ○ | ○ | ○ |
| Copper plate (thickness: 0.8 mm) | Δ | Δ | Δ | Δ |
| Stainless steel plate (thickness: 0.8 mm) | Δ | Δ | Δ | Δ |
| Paper (high quality paper) | ○ | ○ | ○ | ○ |
| PET film (thickness: 125 μm) | Δ | Δ | Δ | Δ |

Remarks
○: Strong adhesion observed so that a material was broken when separated forcedly.
Δ: Adhesion observed, but a material could be completely separated.
*[1]BT substrate: bismaleimide triazine resin substrate
*[2]Halogen-free substrate: MCL-RO-67G manufactured by Hitachi Chemical Co., Ltd. (MCL: registered trade mark)

As being clear from the results shown in Table 2, it has been confirmed that the adhesive pattern had good adhesiveness to various joining members (structural members).

Accordingly, the photocurable and thermosetting adhesive of the present invention is suitable for the formation of the laminated structures in various display devices which require the adhesive pattern as a structural support part (a spacer, a rib, or a barrier) of a fine pattern and also suitable for the formation of the laminated structure electrically connecting other circuit pattern or the electrode of various electronic parts to the fine circuit pattern formed on various substrates, a light reflective part of a back light unit (back lighting device) or the like.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

The International Application PCT/JP2006/310799, filed May 30, 2006, describes the invention described hereinabove and claimed in the claims appended hereinbelow, the disclosure of which is incorporated here by reference.

What is claimed is:
1. A laminated structure, comprising:
   component members and a cured resin product of an adhesive pattern formed on selected regions of the component members from the adhesive pattern-forming resin composition, wherein said resin composition is a photocurable and thermosetting adhesive comprising (A) a carboxyl group-containing photosensitive prepolymer having both a carboxyl group and an ethylenically unsaturated bond in its molecule and an acid value in the range of 30 to 160 mg KOH/g, (B) an epoxy resin, and (C) a photopolymerization initiator;
   wherein said component members are joined so as to be apart from each other through the medium of said cured resin product of the adhesive pattern as a structural support part.

2. The laminated structure according to claim 1, wherein said structural support part is either one of a spacer, a rib, and a barrier.

3. A method of producing a laminated structure, comprising:

applying an adhesive pattern-forming resin composition to a surface of a member to be bonded to form a coating film, wherein said resin composition is a photocurable and thermosetting adhesive comprising (A) a carboxyl group-containing photosensitive prepolymer having both a carboxyl group and an ethylenically unsaturated bond in its molecule and an acid value in the range of 30 to 160 mg KOH/g, (B) an epoxy resin, and (C) a photopolymerization initiator;

selectively exposing the coating film to an active energy ray according to a predetermined pattern; thereafter removing an unexposed portion by development to form an adhesive pattern; then pressing a joining member onto said adhesive pattern so as to be apart from said member through the medium of said adhesive pattern; and thermally curing said adhesive pattern to join said members through the medium of a cured resin product of said adhesive pattern as a structural support part.

4. The method according to claim 3, wherein said carboxyl group-containing photosensitive prepolymer (A) is a carboxyl group-containing photosensitive prepolymer obtained by the esterification of an epoxy group of (a) a polyfunctional epoxy compound having at least two epoxy groups in its molecule with a carboxyl group of (b) an unsaturated monocarboxylic acid and the subsequent addition reaction of (c) a saturated or unsaturated polybasic acid anhydride with a secondary hydroxyl group produced in said esterification.

5. The method according to claim 3, wherein said photocurable and thermosetting adhesive further comprises as a diluent an organic solvent and/or a photopolymerizable monomer.

6. The method according to claim 3, wherein said photocurable and thermosetting adhesive further comprises at least one additive selected from the group consisting of a pigment, conductive particles, ceramic particles, a filler, a dispersant, a thermopolymerization inhibitor, a thickening agent, a plasticizer, a flowability-imparting agent, a stabilizer, an antifoaming agent, a leveling agent, and an anti-blocking agent.

7. The method according to claim 3, wherein said structural support part is either one of a spacer, a rib, and a barrier.

\* \* \* \* \*